United States Patent
Lyu

(10) Patent No.: US 6,372,535 B1
(45) Date of Patent: Apr. 16, 2002

(54) MANUFACTURING METHOD OF A THIN FILM TRANSISTOR

(75) Inventor: Chun-Gi Lyu, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/245,476

(22) Filed: Feb. 5, 1999

Related U.S. Application Data

(63) Continuation-in-part of application No. 09/017,202, filed on Feb. 2, 1998, now Pat. No. 5,998,229.

(30) Foreign Application Priority Data

Sep. 3, 1998 (KR) .............................. 98-36232

(51) Int. Cl.$^7$ .......................... H01L 21/20; H01L 21/00
(52) U.S. Cl. ....................... 438/30; 438/158; 438/159
(58) Field of Search ........................ 438/30, 158, 159

(56) References Cited

U.S. PATENT DOCUMENTS

| | | | |
|---|---|---|---|
| 5,491,347 A | * 2/1996 | Allen et al. | 257/59 |
| 5,622,814 A | * 4/1997 | Miyata et al. | 438/30 |
| 5,721,601 A | * 2/1998 | Yamaji et al. | 349/148 |
| 5,796,121 A | * 8/1998 | Gates | 257/59 |
| 5,831,708 A | * 11/1998 | Hiraihsi et al. | 349/143 |
| 5,834,071 A | * 11/1998 | Lin | 427/578 |
| 5,998,229 A | * 12/1999 | Lyu et al. | 438/30 |

FOREIGN PATENT DOCUMENTS

| JP | 5-226654 | 9/1993 |
|---|---|---|
| JP | 5-283427 | 10/1993 |
| JP | 7-176747 | 7/1995 |
| JP | 9-223691 | 8/1997 |
| JP | 11-40813 | 2/1999 |

OTHER PUBLICATIONS

Notice of Rejection, Japanese Patent Application No. Hei11–023336, Dec. 13, Hei11.

* cited by examiner

*Primary Examiner*—Richard Elms
*Assistant Examiner*—Michael S. Lebentritt
(74) *Attorney, Agent, or Firm*—Myers Bigel Sibley & Sajovec

(57) ABSTRACT

A gate electrode is formed on the substrate, and a gate insulating layer is formed over the gate electrode. An amorphous silicon layer and a doped amorphous silicon layer is formed in sequence. On the doped amorphous silicon layer, a source and a drain electrode made of molybdenum or molybdenum-tungsten alloy is formed and the doped amorphous silicon layer is dry etched. When the doped amorphous silicon layer is dry etched, the source/drain electrodes or the photoresist pattern used to form the source/drain electrodes is used as a mask, and a $HCl+CF_4$ gas system is used for dry etching gas. After dry etching the doped amorphous silicon layer, in-situ He plasma treatment is performed. If $HCl+CF_4+O_2$ dry etching gas is used to etch the doped amorphous silicon layer, the characteristics of TFT may be improved with one dry etch process without the additional plasma treatment. Furthermore, the corrosion of wire made of aluminum or aluminum alloy may be prevented for using in-situ oxygen plasma treatment after dry etching the doped amorphous silicon layer.

11 Claims, 23 Drawing Sheets

| Gas Kinds | Corrosion |
|---|---|
| Cl2+SF6 | Yes |
| HCl+SF6 | Yes |
| HCl+CF4 | Yes |
| 1st: Cl2+SF6<br>2nd: O2 Plasma | No |

FIG.11

| Condition | | TFT characteristics | | | |
|---|---|---|---|---|---|
| | | Ioff (pA) | Ion (μA) | Vth (v) | Gradiant |
| Power (watts) | 500 | 0.18 | 2.18 | 3.1 | 101 |
| | 800 | 0.2 | 2.1 | 3.1 | 100 |
| | 1000 | 0.2 | 2.1 | 3.7 | 99 |
| Pressure (mTorr) | 400 | 0.1 | 2.1 | 3.0 | 99 |
| | 600 | 0.1 | 2.1 | 3.2 | 99 |
| | 800 | 0.1 | 2.1 | 3.0 | 101 |
| | 1000 | 0.1 | 2.0 | 3.3 | 99 |

FIG.12

| Fluoride | Temper-atures(°C) | Chloride | Temper-atures(°C) |
|---|---|---|---|
| $WF_6$ | 20 | $WCl_6$ | 345 |
| $WOF_4$ | 190 | $WOCl_4$ | 230 |
| $M_oF_6$ | 35 | $M_oCl_5$ | 270 |
| $M_oOF_4$ | 180 | $M_oOCl_4$ | 180 |
| $TiF_4$ | 385(s) | $TiCl_4$ | 135 |
| $TaF_5$ | 230 | $TaCl_5$ | 240 |
| $SiF_4$ | −85 | $SiCl_4$ | 60 |
| $AlF_3$ | 1290(s) | $AlCl_3$ | 180(s) |

FIG.13

| W content (atm%) | Cl2+SF6 | HCl+SF6 |
|---|---|---|
| 0% | 200 Å/min | 150 Å/min |
| 0% – 10% | 243 Å/min | 261 Å/min |
| 10% – 20% | 592 Å/min | 280 Å/min |
| 20% – 30% | 604 Å/min | 313 Å/min |

| O2 Contents (SCCM) | etch rate(Å/min) | | Remark |
|---|---|---|---|
| | a-Si | Mo-W | |
| 20 | 598 | 650 | |
| 50 | 320 | −100 | lot of polymer formation |
| 100 | 219 | −200 | |

| O2 Contents (SCCM) | etch rate (Å/min) | | Remark |
|---|---|---|---|
| | a-Si | Mo-W | |
| 20 | 771 | 52 | |
| 50 | 708 | -166 | lot of polymer formation |
| 100 | 115 | -100 | |

| Test Condition | TFT characteristics | | | |
|---|---|---|---|---|
| | Ioff(pA) | Ion(μA) | Vth(dc) | Grad |
| HCl+CF4 | 2.04 | 3.47 | 2.25 | 128 |
| HCl+CF4+ He Plasma | 0.4 | 3.0 | 2.6 | 118 |
| HCl+CF4+O2 | 0.3 | 3.22 | 2.7 | 123 |

FIG.31

| Condition | Condition for P.R | Condition for etching the nt a-silager | | etched thickness(A) |
|---|---|---|---|---|
| | | Etching | Ashing | |
| 1 | Etching the nt a-silager after P.R strip | Etching+He Plasma | Ashing | 1283 |
| 2 | | Etching(CF₄+HCl)+ He Plasma | Ashing | 1289 |
| 3 | | Etching(CF₄+HCl) | Ashing+ in-situ He Plasma | 1154 / 1167 |
| 4 | Etching the nt a-silager with P.R Lovering | Etching | Ashing | 1166 |
| 5 | | Etching(CF₄+HCl) | Ashing+ H₂ Plasma | 1114 / 1114 |
| 6 | | Etching(CF₄+HCl) | Ashing+ in-situ He Plasma | 1211 |

FIG.32

| Condition | Ioff(pA) | Ion(μA) | Vth(V) | Grad | Contact Resistance (KΩ) | S/D Resistance (KΩ) |
|---|---|---|---|---|---|---|
| 1 | 0.2 | 2.7 | 3.01 | 113 | 8.18 | 2.20 |
| 2 | 0.08 | 2.95 | 2.88 | 117 | 8.60 | 2.23 |
|   | 0.24 | 2.83 | 2.84 | 115 | 9.02 | 2.23 |
|   | 0.26 | 3.01 | 2.82 | 119 | 9.99 | 2.24 |
|   | 0.18 | 2.85 | 2.97 | 116 | 8.62 | 2.19 |
| 3 | 0.51 | 3.37 | 2.48 | 127 | 9.58 | 2.20 |
|   | 0.63 | 3.28 | 2.48 | 125 | 8.68 | 2.19 |
| 4 | 5.68 | 4.02 | 2.59 | 142 | 17.2 | 2.19 |
|   | 1.27 | 3.97 | 2.75 | 141 | 23.4 | 2.19 |
| 5 | 0.24 | 3.67 | 2.84 | 133 | 25.4 | 2.17 |
| 6 | 0.64 | 4.11 | 2.49 | 144 | 65.8 | 2.19 |
|   | 0.57 | 4.28 | 2.53 | 146 | 37.7 | 2.18 |
|   | 0.68 | 4.21 | 2.59 | 145 | 25.6 | 2.18 |

FIG. 33

| Condition | Gate AClCD | S/D AClCD | Cap | Area (μm²) | Cl(F/cm²) | Designed W | Designed L | Actual W | Actual L | Mobility |
|---|---|---|---|---|---|---|---|---|---|---|
| 1 | 9.231 | 8.847 | 0.9 | 498713.28 | 1.56*10⁸ | 14 | 3.5 | 12.847 | 4.653 | 0.570 |
| | | | 77.85 | 498713.28 | 1.56*10⁸ | | | | | 0.644 |
| | | | 77.75 | 498713.28 | 1.56*10⁸ | | | | | 0.614 |
| 2 | 9.231 | 8.847 | 77.06 | 498713.28 | 1.56*10⁸ | | | 12.847 | 4.653 | 0.664 |
| | | | 76.91 | 498713.28 | 1.56*10⁸ | | | | | 0.638 |
| | | | 77.68 | 498713.28 | 1.56*10⁸ | | | | | 0.750 |
| 3 | 9.231 | 8.847 | 77.27 | 498713.28 | 1.56*10⁸ | | | 12.847 | 4.653 | 0.731 |
| | | | 76.08 | 498521.21 | 1.56*10⁸ | | | | | 0.951 |
| 4 | 9.095 | 8.847 | 77.72 | 498521.21 | 1.56*10⁸ | | | 12.870 | 4.630 | 0.918 |
| 5 | 9.095 | 8.847 | 79.01 | 498521.21 | 1.56*10⁸ | | | 12.870 | 4.630 | 0.803 |
| | | | 78.87 | 498521.21 | 1.56*10⁸ | | | | | 0.942 |
| 6 | 9.095 | 8.87 | 79.57 | 498521.21 | 1.56*10⁸ | | | 12.870 | 4.630 | 0.961 |
| | | | 80.45 | 498521.21 | 1.56*10⁸ | | | | | 0.937 |

MANUFACTURING METHOD OF A THIN FILM TRANSISTOR

This application is a continuation-in-part of prior U.S. patent application Ser. No. 09/017,202, filed Feb. 2, 1998, which is now U.S. Pat. No. 5,998,229.

BACKGROUND OF THE INVENTION (a) Field of the Invention

The present invention relates to a manufacturing method of a thin film transistor for liquid crystal displays.

(b) Description of the Related Art

A conventional thin film transistor has a hydrogenated amorphous silicon layer as an active layer. A doped hydrogenated amorphous silicon layer heavily doped with n-type impurities formed on the amorphous silicon layer is used to decrease the contact resistance between the amorphous silicon layer and source/drain electrodes. To form an etch-back type TFT, the doped amorphous silicon layer is etched away using the source/drain electrodes as a mask. However, there is a problem that the source/drain electrodes are consumed in the step of etching the doped amorphous silicon layer.

To prevent-the above-described problem, a photoresist pattern used to form the source/drain electrodes is used as an etching mask in the step of etching the doped amorphous silicon layer and the photoresist pattern is stripped thereafter. However, the amorphous silicon layer experiences a bad influence during the step of stripping the hardened photoresist pattern and the characteristics of the TFT become worse.

SUMMARY OF THE INVENTION

In view of the above, an object of the present invention is to improve the characteristics of a TFT for liquid crystal display.

This and other objects, features and advantages are provided, according to the present invention, by performing a He plasma treatment or an oxygen plasma treatment after dry etching the doped amorphous silicon layer used as a ohmic contact layer of a TFT.

The He plasma treatment and the oxygen plasma treatment may be used in case of forming a data pattern including a source and a drain electrodes made of a molybdenum or molybdenum alloy and an aluminum or aluminum alloy, respectively.

After etching the doped amorphous silicon layer, He plasma treatment or the oxygen plasma treatment with in-situ may be performed to improve the characteristics of the TFT or to prevent corrosion the aluminum or aluminum alloys.

When the doped amorphous silicon layer is dry etched, a gas system consisting of a hydrogen halide and at least one selected from $CF_4$, $CHF_3$, $CHClF_2$, $CH_3F$ and $C_2F_6$ may be used, especially, an $HCl+CF_4$ gas system may be preferable.

Furthermore, $HCl+CF_4+O_2$ gas system including an oxygen may be preferable in case of forming a data pattern including a source and a drain electrodes made of a molybdenum or molybdenum alloy to improve the characteristics of the TFT.

The doped amorphous silicon layer may be etched using the source and the drain electrodes or the photoresist pattern used to form the source and the drain electrodes as a mask.

BRIEF DESCRIPTION OF THE DRAWINGS

FIG. 9 is a table showing a corrosion of a wire including aluminum for some dry etching gas systems.

FIGS. 10 and 11 are graphs illustrating the I–V characteristics of TFT as a function of the pressure and the power under the oxygen plasma treat.

FIG. 12 is a table showing volatile and sublime temperatures of refractory metal halides under the room atmosphere pressure (1 atm).

FIG. 13 is a table showing the etch rates of the MoW layer for some dry etching gas systems according to the first embodiment of the present invention.

FIG. 31 is a table showing manufacturing methods according to the second embodiment and the etch rates of the doped amorphous silicon layer.

FIG. 32 is a table showing the results of the EDS (electric data system) test of the TFT according to the second embodiment.

FIG. 33 is a table showing the mobility calculated using the EDS data according to the second embodiment.

DETAILED DESCRIPTION OF THE PREFERRED EMBODIMENTS

Figure 1:
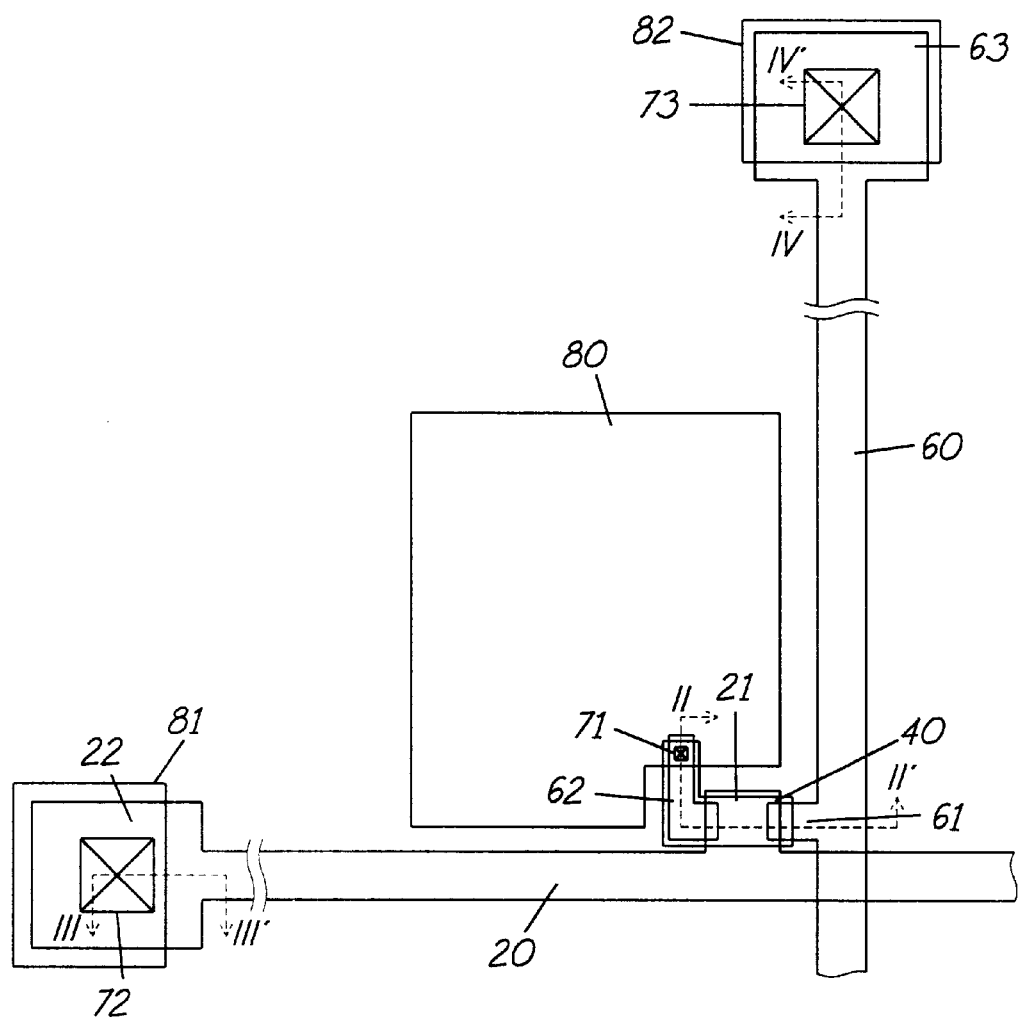
FIG. 1 is a layout view of a TFT substrate according to a first embodiment of the present invention.

The present invention will now be described more fully hereinafter with reference to the accompanying drawings, in which preferred embodiments of the present invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Figure 2:
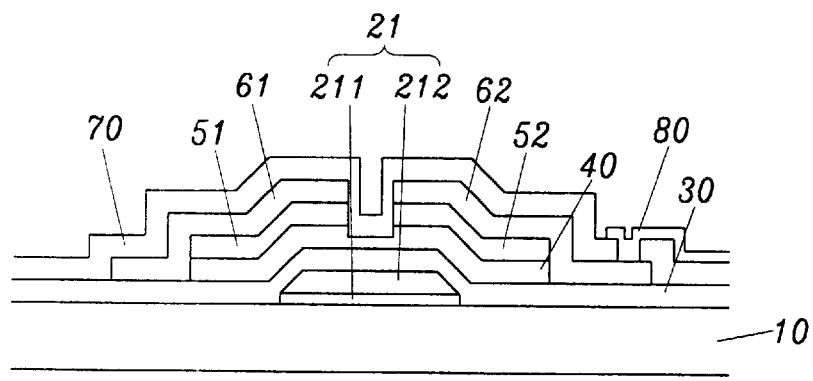
FIGS. 2–4 are cross-sectional views of the TFT substrate shown in FIG. 1 taken along the lines II–II', III–III', IV–IV' respectively.
Figure 3:
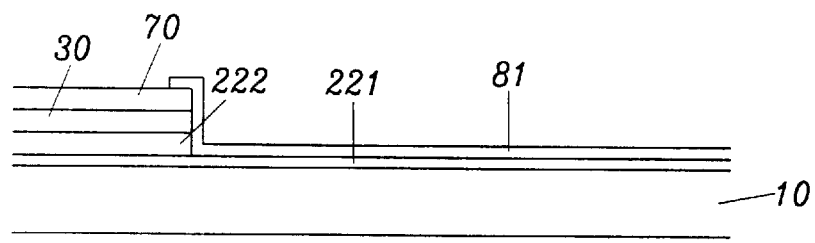
Figure 4:
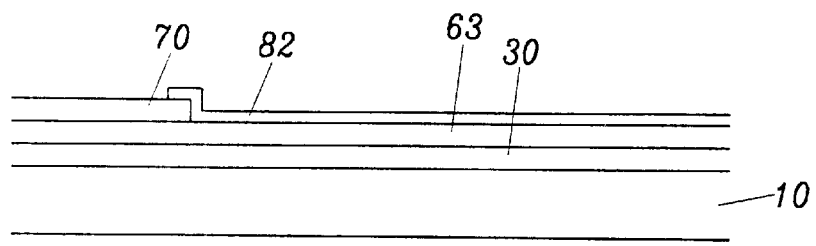

First, the structure of a TFT substrate according to the first embodiment of the present invention will be described. FIG. 1 is a layout view of a TFT substrate according to a first embodiment of the present invention. FIGS. 2–4 show cross-sectional views of the TFT substrate shown in FIG. 1 taken along the lines II–II', III–III', IV–IV' respectively.

A gate pattern including a gate line 20, a gate electrode 21 which is a branch of the gate line 20, and a gate pad which is formed at the end of the gate line 20 is formed on a substrate 10. The gate electrode 21 and the gate pad 22 include lower layers 211, 221 made of chromium and upper layers 212, 222 made of aluminum-neodymium alloy, and the upper layer 222 of the gate pad 22 made of aluminum-neodymium alloy is removed. Though it is not shown in the Figure, the gate line 20 also includes a chromium layer and an aluminum-neodymium alloy layer. The gate pad 22 transmits scanning signals to the gate line 20 from the outside.

A gate insulating layer 30 is formed over the gate pattern 20, 21 and 22, and the gate insulating layer 30 has a contact hole 72 exposing the lower layer 221 of the gate pad 22. A hydrogenated amorphous silicon layer 40 is formed on the gate insulating layer 30 over the gate electrode 21, and a heavily doped n+ hydrogenated amorphous silicon layer 51 and 52 is formed on the amorphous silicon layer 40 and divided into two portions with respect to the gate electrodes 21.

A data line 60 is formed longitudinally on the gate insulating layer 30, and a data pad 63 which is formed at the end of the data line 60 and transmits display signals from the outside to the data line 60. A source electrode 61 which is a branch of the data line 60 is formed on the one portion 51 of the doped amorphous silicon layer, and a drain electrode 62 is formed on the other portion 52 of the doped amorphous silicon layer. A data pattern including the data line 60, the source and the drain electrodes 61 and 62 and the data pad 63 is made of molybdenum-tungsten alloy.

A passivation layer 70 is formed on the data pattern 60, 61, 62 and 63 and on the amorphous silicon layer 50, which is not covered with the data pattern. The passivation layer 70 and the gate insulating layer 30 have contact holes 72, 71, 73 exposing the lower layer 221 of the gate pad 22, the drain electrode 62 and the data pad 63 respectively.

An ITO pixel electrode 80 is formed on the passivation layer 70 and connected to the drain electrode 62 through the contact hole 71. An ITO electrode 81 for gate pad connected to the exposed lower layer 221 of the gate pad 22 and an ITO electrode 82 for data pad connected to the data pad 63 and transmitting the data signal to the data line 60 are also formed.

Now, a manufacturing method of the TFT substrate shown in FIGS. 1–4 will be described. FIGS. 5A–8C are cross-sectional views illustrating a manufacturing method according to the first embodiment of the present invention. The capital letters A, B and C following Arabic numerals in the view numbers show the TFT, the gate pad and the data pad regions respectively. The manufacturing-method according to the first embodiment uses 5 masks.

Figure 5A:
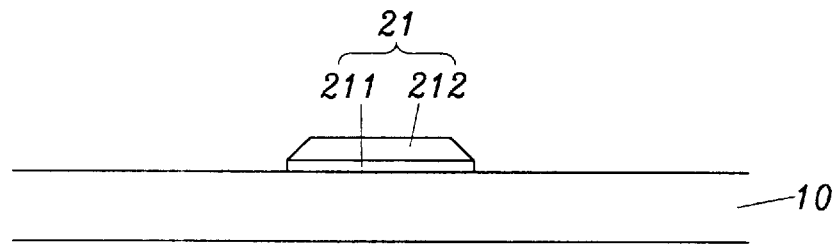
FIGS. 5A–8C are cross-sectional views illustrating a manufacturing method of the TFT substrate shown in FIG. 1 according to the first embodiment of the present invention.
Figure 5B:
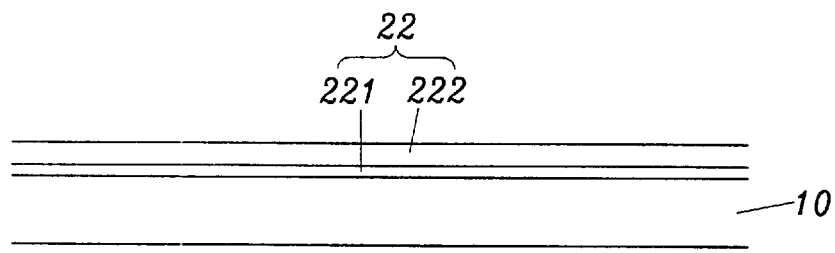
Figure 5C:
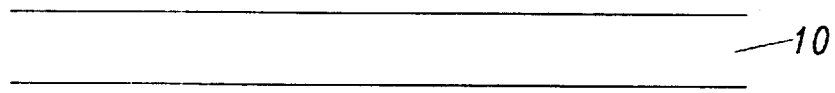

First, as shown in FIGS. 5A–5C, a chromium layer and an aluminumneodymium alloy layer are deposited in sequence. The double layers are photo etched using a first mask to form a gate pattern including a gate line 20, a gate electrode 21 and a gate pad 22.

The gate pattern may be a single layer molybdenum, molybdenum-tungsten alloy, or have a double layered structure including a first layer of aluminum and aluminum alloy and a second layer of molybdenum, molybdenum-tungsten alloy or a first layer of chromium and a second layer of aluminum, etc.

Figure 6A:
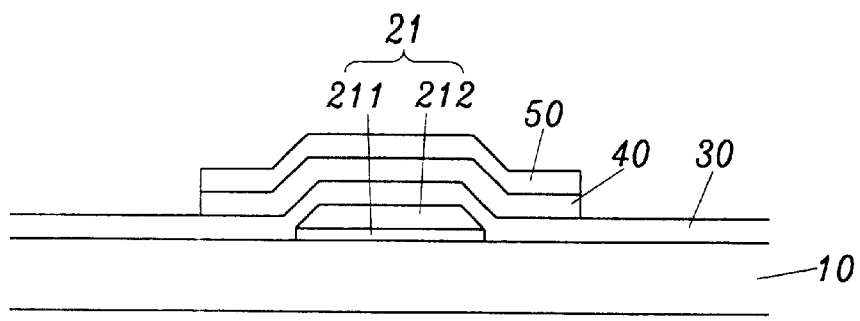
Figure 6B:
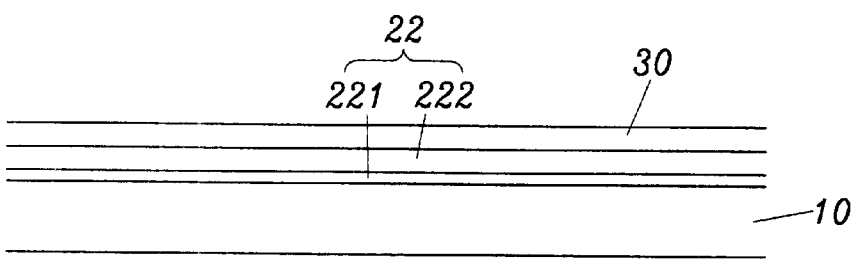
Figure 6C:
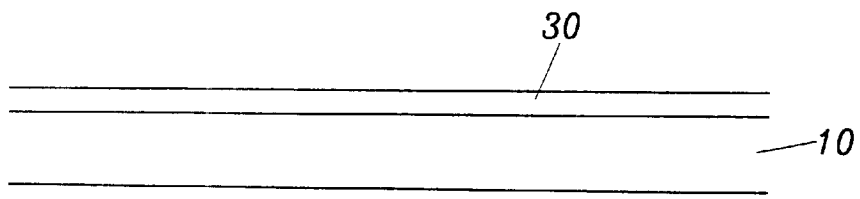

As shown in FIG. 6A, a gate insulating layer 30 made of silicon nitride, a hydrogenated amorphous silicon layer 40 and a heavily doped n+ hydrogenated amorphous silicon layer 50 are deposited in sequence. The doped amorphous silicon layer 50 and the amorphous silicon layer 40 are photo etched using a second mask. As shown in FIGS. 6B and 6C, the gate pad and the data pad region are covered with the gate insulating layer 30.

Figure 7A:
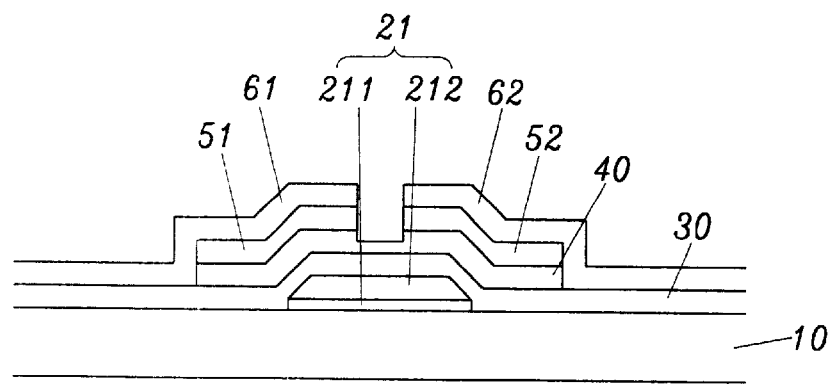
Figure 7B:
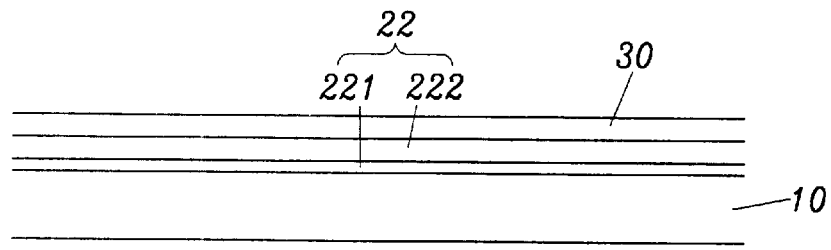
Figure 7C:
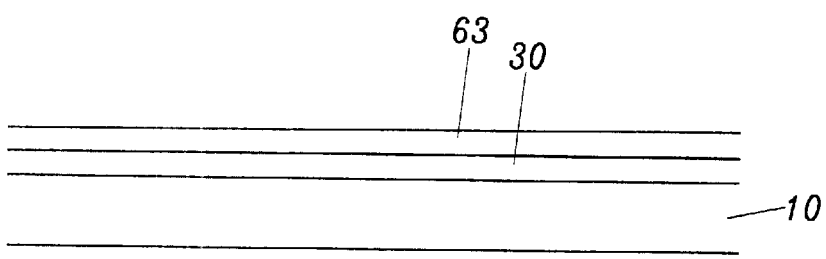

As shown in FIGS. 7A–7C, a molybdenum or a molybdenum-tungsten alloy layer is deposited on the doped amorphous silicon layer 50 and etched using a third mask to form a data pattern including a data line 60, a source and a drain electrodes 61 and 62 and a data pad 63.

The data pattern may be formed using chromium, tantalum or the like conductive materials, and may have a double layered structure of a chromium layer and one of molybdenum and molybdenum-tungsten alloy layer.

The exposed portion of the doped amorphous silicon layer 50 is plasma dry etched using the source and the drain electrodes 61 and 62 as an etch mask to divide the doped amorphous silicon layer into two portions and to expose the amorphous silicon layer 40 between the two portions of the doped amorphous silicon layer 51 and 52.

If the data pattern is made of an aluminum or aluminum alloy, a mixture gas of fluoride gas ($SF_6$, $CF_4$, etc.) and chloride gas (HCl, $Cl_2$, etc.) to have a good etch selectivity of the doped amorphous silicon layer 50 for the exposed gate insulating layer 30 and the exposed data pattern 60, 61, 62 and 63, and to control the etch velocity of the amorphous silicon layer 40 and the doped amorphous silicon layer 50. However, because this gas, especially chloride gas, corrodes the aluminum or aluminum alloy of the exposed data pattern 60, 61, 62 and 63, the possibility of the open of wire may be increased. To solve this problem, an oxygen plasma treatment may be used.

Figures 9, 10:
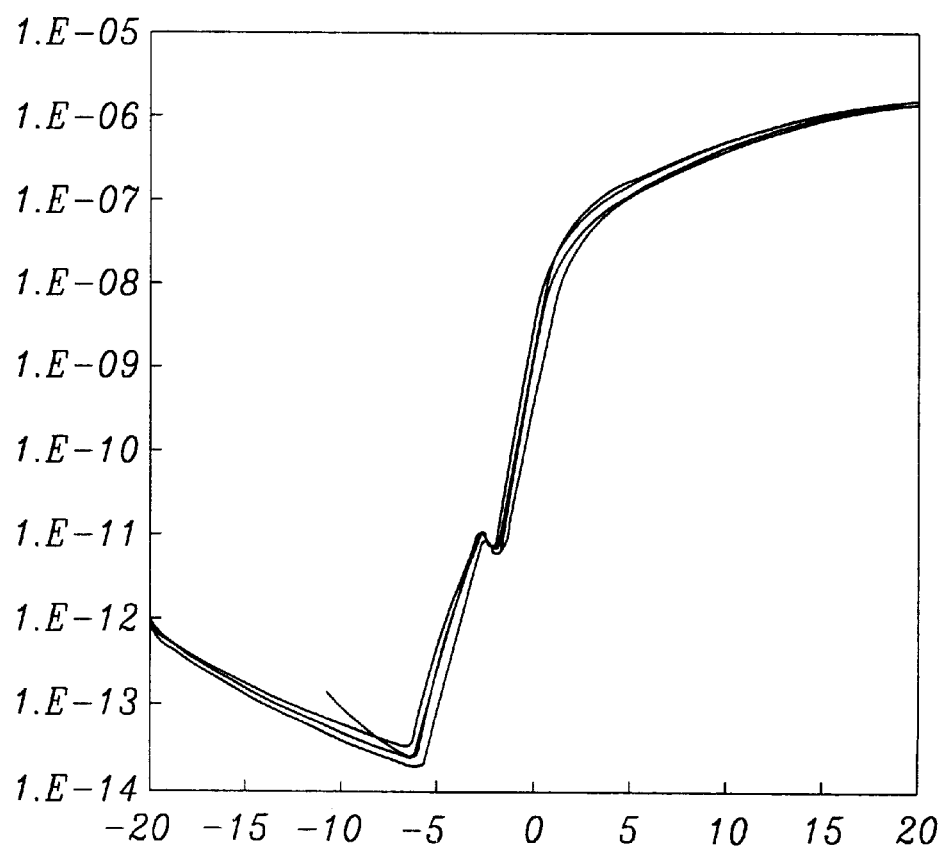

FIG. 9 is a table showing a corrosion of a wire including aluminum for some dry etching gas systems.

As shown in FIG. 9, if $Cl_2+SF_6$, $HCl+SF_6$ or $HCl+CF_4$ as a dry etching gas is used only, the corrosion of the wire is generated. If $HCl+CF_4$ as a dry etching gas and an oxygen treatment are used, the corrosion of the wire disappear.

As this result, when the gas including chloride gas are used as a dry etching gas to etch the amorphous silicon layer the corrosion of the aluminum or aluminum alloy may be prevented for adding the oxygen plasma treatment. Here, the small amount of $CF_4$, $SF_6$, $C_2F_6$, $CHF_3$ or $C_2F_8$ may be included in the oxygen plasma process.

FIGS. 10 and 11 are graphs illustrating the I–V characteristics of TFT as a function of the pressure and the power under the oxygen plasma treat. Here, powers are 500, 800 and 1,000 watts, and pressures are 400, 600, 800 and 1,000 mTorr.

As shown in FIGS. 10 and 11, Off state current Ioff is equal to or less than 0.2 pA, On state current Ion is between 2.0 to 2.2 $\mu A$, threshold voltage Vth is between 3 to 3.7V, and gradient is 99 to 101.

That is, if the oxygen plasma treatment is performed before the passivation layer is deposited, and the corrosion of wire made of the aluminum or aluminum alloy may be prevented. As a result, the wire is not opened, and the good characteristic of TFT is achieved.

The oxygen treatment to prevent the corrosion the aluminum or aluminum alloy for dry etching the amorphous silicon may be used in manufacturing method of another liquid crystal display having a pixel electrode and a common electrode to drive liquid crystal molecules, which are formed on same substrate of a liquid crystal display. This treatment may be used to form data pattern having a double-layered structure including an aluminum or aluminum alloy layer, and is performed with in-situ.

If the data pattern is made of molybdenum or molybdenum-tungsten alloy, the dry etching gas for the doped amorphous silicon layer 50 may consume the molybdenum or molybdenum-tungsten alloy layer. Therefore, the dry etching gas should be selected cautiously that the etch rate of molybdenum or molybdenum-tungsten alloy is equal to or less than 100 Å/min. A gas system including a hydrogen halide and at least one selected from $CF_4$, $CHF_3$, $CHClF_2$, $CH_3F$ and $C_2F_6$ is proper and especially an HCl+$CF_4$ gas system is good.

FIG. 12 is a table showing volatile and sublime temperatures of refractory metal halides under the room atmosphere pressure (1 atm). FIG. 10 is a table showing the etch rates of the molybdenum and the molybdenum tungsten alloy for two dry etching gas systems according to the first embodiment of the present invention. Added character s enclosed by a parenthesis in FIG. 9 indicates the sublime temperature.

In the step of etching the doped amorphous silicon layer using the source/drain electrodes, a gas system of a fluoride gas ($SF_6$, $CF_4$, etc.) and a chloride gas (HCl, $Cl_2$, etc.) may be used in order to obtain a sufficient etch rate for the doped hydrogenated amorphous silicon and the hydrogenated amorphous silicon and to get a proper selectivity between the amorphous silicon layer and the gate insulating layer which is not covered with the amorphous silicon layer and made of silicon nitride. However, as shown in FIG. 12, since halides ($WF_6$, $WCl_6$, $MoF_6$, $MoCl_5$) or oxygen halides ($WOF_4$, $WOCl_4$, $MoOF_4$, $MoOCl_4$) of refractory metals such as molybdenum or tungsten have low volatile or sublime temperatures, a lot of molybdenum or molybdenum-tungsten alloy are consumed during the amorphous silicon is etched. On the other hand, the volatile temperatures (−85°, 60°) of the silicon halides ($SiF_4$, $SiCl_4$) are very low and the sublime temperatures (1290°, 180°) of the aluminum halides ($AlF_3$, $AlCl_3$) are relatively high.

As shown in FIG. 13, the molybdenum or the molybdenum alloy layer of data pattern 61, 62 is etched by the rate of 200–610 Å/min for a HCl+$SF_6$ gas system and by the rate of 150–320 Å/min for a $Cl_2$+$SF_6$ gas system.

Hydrogenated amorphous silicon may form a volatile material both under the fluorine (F) or chlorine (Cl) plasma process. However, as shown in FIG. 12, in the case of molybdenum-tungsten alloy, the volatile temperatures of the fluorides ($MoF_6$, $MoOF_4$, $WF_6$, $WOF_4$) are low and those of the chlorides ($MoCl_5$, $MoOCl_4$, $WCl_6$, $WOCl_4$) are relatively high. Therefore, the molybdenum-tungsten alloy is delicate under the fluoride (especially $SF_6$) plasma process.

Moreover, as shown in FIG. 13, the etch rate is a little increased as the tungsten contents in molybdenum-tungsten alloy is increased. It is in accordance with the expectation that the etch rate would be increased as the tungsten contents in molybdenum-tungsten alloy is increased because the volatile temperature of the tungsten fluoride ($WF_6$) is lower than that of the molybdenum fluoride ($MoF_6$). The etch rate using the $SF_6$+$Cl_2$ gas system is a little larger than using the $SF_6$+HCl gas system, because $Cl_2$ can make more chlorine ions than HCl. However, since polymerization is not occurred so much when $SF_6$ gas is used as a source of fluorine ion, molybdenum-tungsten alloy is consumed a lot for two gas systems.

Figure 14:
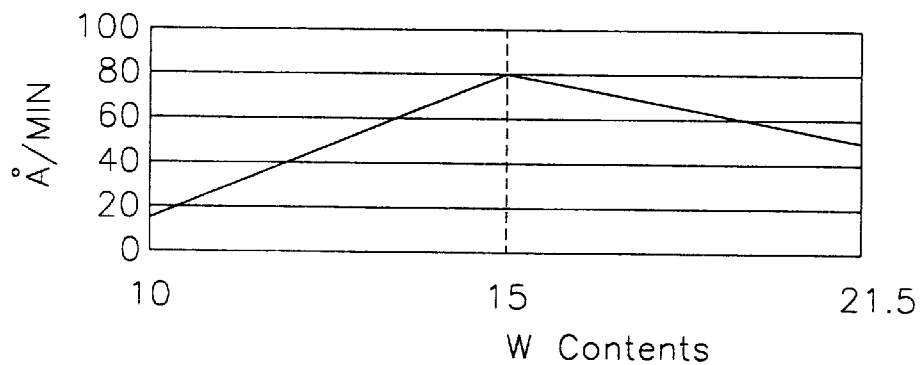
FIG. 14 is a graph illustrating the etch rate of the MoW layer for another dry etching gas system according to the first embodiment of the present invention.

On the other hand, the etch rate of molybdenum-tungsten alloy may be decreased for a $CF_4$+HCl gas system. FIG. 14 is a graph illustrating the etch rate of MoW for a $CF_4$+HCl gas system as a function of tungsten content according to the first embodiment of the present invention. The condition for dry etching was the pressure of 80 pascal, the power of 800 W and the flux of the mixed gases of 500 sccm.

As shown in FIG. 14, the molybdenum alloy layer of data pattern 61 and 62 is etched by the rate of 15–80 Å/min when a CF4+HCl gas system is used. Compared to the results in FIG. 13, the etch rate is relatively small. It is because the H ion of HCl decreases the density of the fluorine which is the main source for etching the molybdenum-tungsten alloy. Moreover, the polymerization effect that adsorbs the fluorocarbon polymer film [-(CF)n- ] to the surface is increased to lessen the etch rate. In general, the etch rate for $CF_4$ gas is smaller than that for $SF_6$. It seemed that the SF6 gas make more free fluorine ions than the $CF_4$ gas in the same ionization condition. Especially, when the $CF_4$ gas is mixed with the HCl gas, the fluorocarbon polymer film is formed prosperously. Since the molybdenum-tungsten alloy is etched when the amount of fluorine is very large compared with that of carbon, the etch rate is decreased abruptly.

Figure 15:
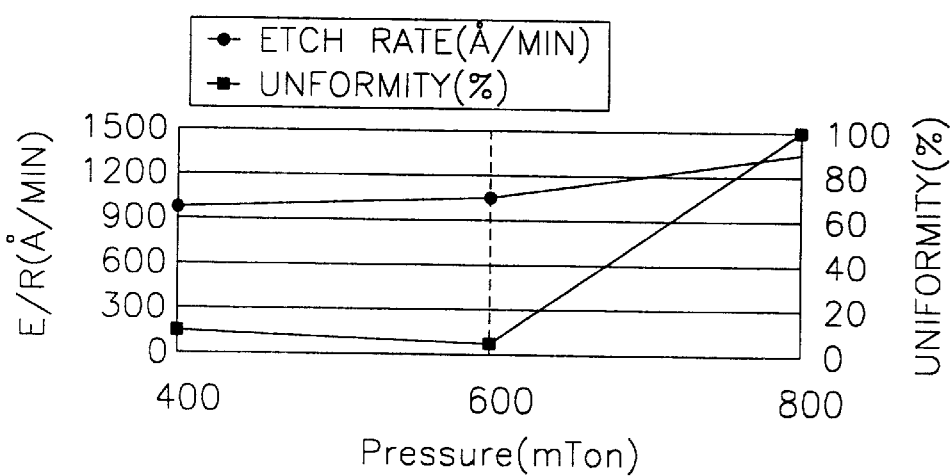
FIGS. 15–17 are graphs showing the etch rates and the uniformity as a function of the pressure, the power and the flux of the gas respectively.
Figure 16:
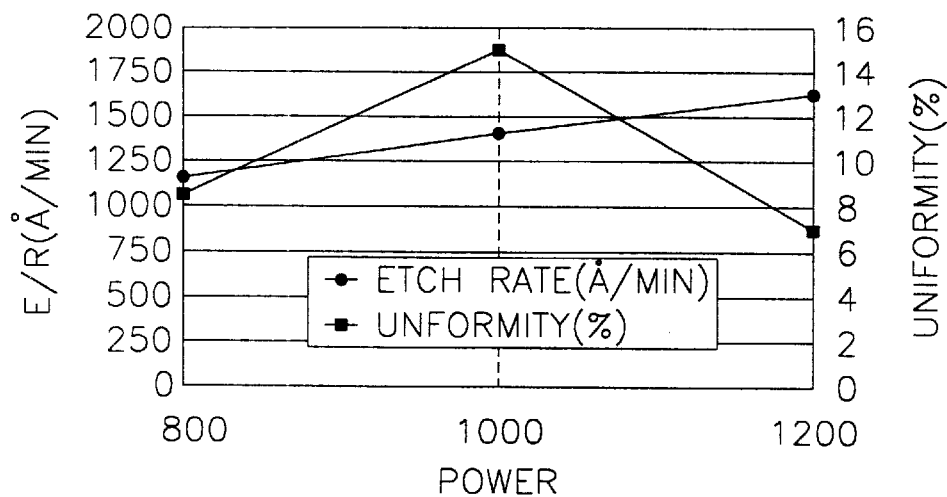
Figure 17:
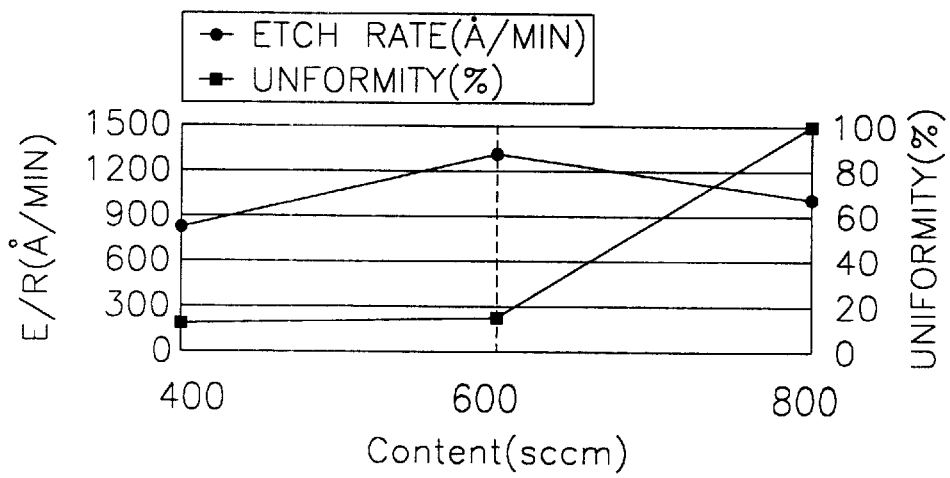

FIGS. 15–17 are graphs showing the etch rates and the uniformity as a function of the pressure, the power and the flux of the gas.

As shown in FIG. 15 which is a graph showing the etch rate and the uniformity as a function of pressure, the etch rate increases as the pressure increases and the uniformity is very large at the pressure of 800 mTorr.

As shown in FIG. 16 which is a graph showing the etch rate and the uniformity as a function of power, the etch rate also increases as the power increases and the uniformity is the maximum when the power is 1,000 W.

As illustrated in FIG. 17 which is a graph showing the etch rate and the uniformity as a function of flux of the mixed gas, the uniformity increases as the flux increases and the etch rate is the maximum when the flux is 600 sccm.

From the above-described results, if the $CF_4$+HCl gas is used to etch the doped amorphous silicon layer, the consuming of the data pattern made of the molybdenum-tungsten alloy is equal to or less than 50 Å during the step of etching the doped amorphous silicon layer.

Figure 18:
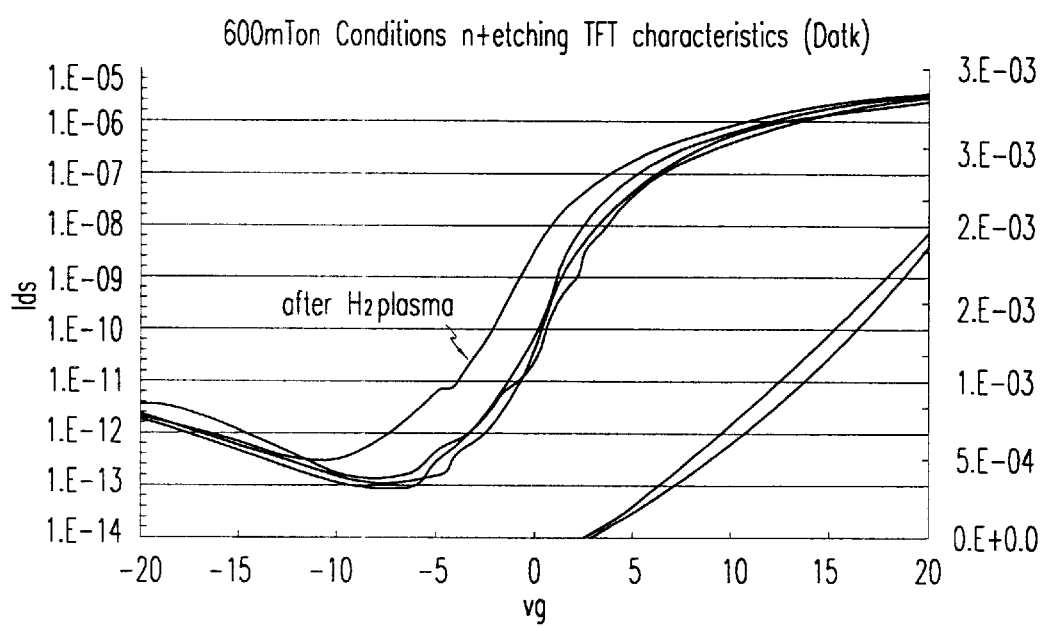
FIG. 18 is a graph illustrating the I–V characteristics of TFT before and after the $H_2$ plasma treatment.

FIG. 18 is a graph illustrating the I–V characteristics of a TFT after etching the doped amorphous silicon layer using the $CF_4$+HCl gas system. Off state current Ioff is equal to or more than 10 pA at the gate voltage of −5V, and on state current Ion is equal to or more than 4 $\mu$A at the gate voltage of 20V. That is, Ion is satisfactory but Ioff is not. However, Ioff can be decreased if the $H_2$ plasma treatment is performed before the passivation layer is deposited. It seems that a thin conductive film is formed on the surface of the channel region due to ion diffusion of molybdenum and tungsten, formation of silicide or re-deposition of the by-product of the etched metal after etching the doped amorphous silicon layer, and it is removed or diluted during the $H_2$ plasma treatment to make the surface characteristics of the channel region to be better.

The characteristic of the TFT is much more improved if in-situ He plasma treatment is performed.

Figure 19:
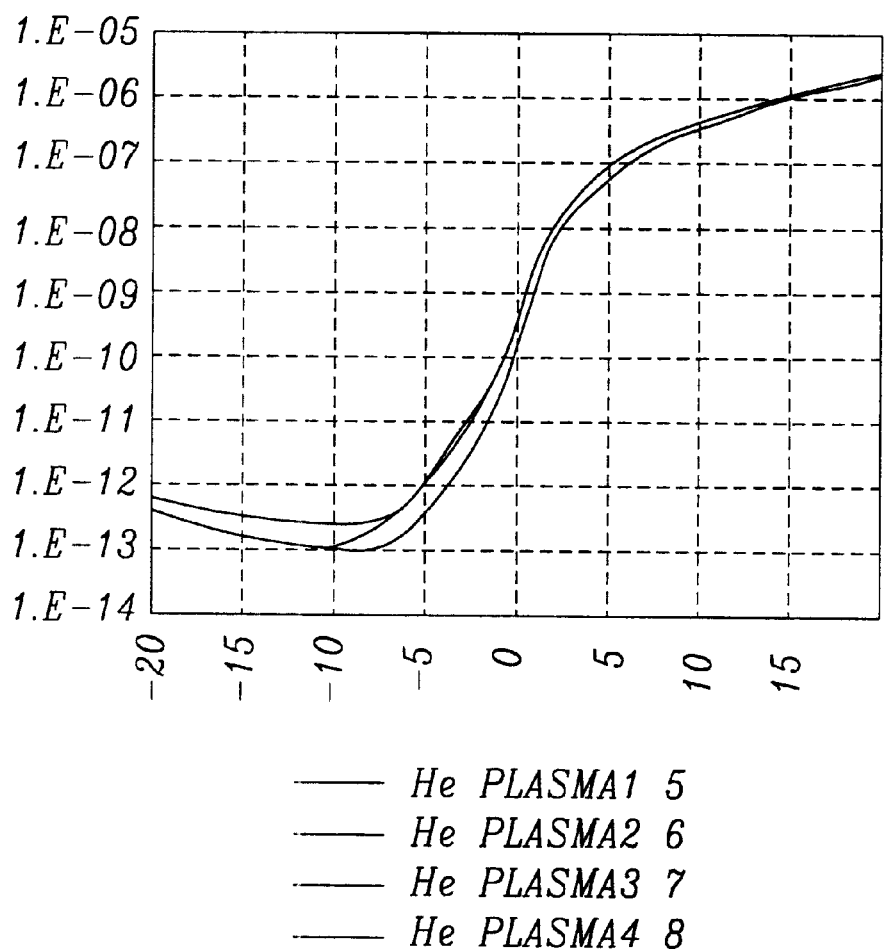
FIG. 19 is a graph illustrating the I–V characteristics of TFT after the He plasma treatment.
Figure 20:
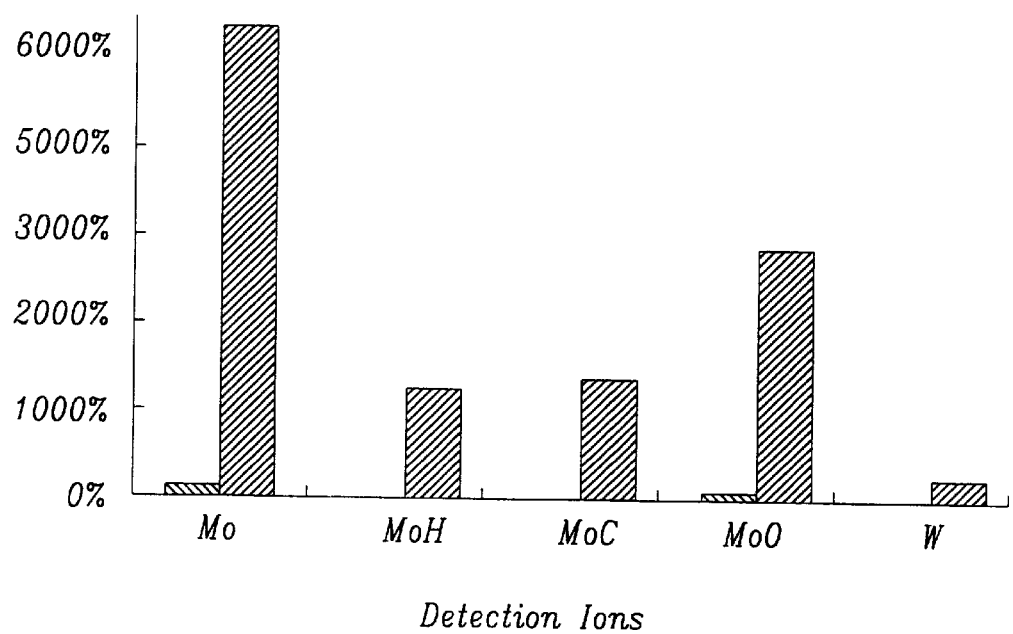
FIG. 20 is a graph showing the kinds and the amounts of the ions detected during the manufacturing process according to the first embodiment of the present invention.

FIG. 19 is a graph illustrating the I–V characteristics of a He plasma treated TFT. As shown in FIG. 19, Ioff is decreased by the same amount as the case applying the $H_2$ plasma treatment, that is, Ioff is equal to or less than 1 pA. Moreover, Ion is not decreased, it is different from the case applying the $H_2$ plasma treatment. If the $CF_4$+HCl gas is used, lots of the fluorocarbon polymer are formed to protect the metal pattern and the silicon layer is etched by fluorine radicals. Therefore, the fluorocarbon polymer film has to be removed effectively to prevent the characteristic of the TFT from degrading. To remove the fluorocarbon polymer film, the hardened polymer during the etching process should be softened and cleaning and annealing process is needed. The results shown in FIG. 19 demonstrate this fact, and FIG. 20 is a graph showing the kinds and the amounts of the ions detected during the manufacturing process according to the first embodiment of the present invention. As shown in FIG. 20, a lot of Mo ions are detected and compounds such as MoO, MoH, MoC are detected. The compounds are formed to protect the data pattern and cause the degradation of the characteristics of the TFT.

The above-described $H_2$ plasma treatment or He plasma treatment is second method performed after dry etching to prevent the degradation of the characteristics of the TFT. On the other hand, only the dry etching gas system including chlorine gas, fluorine gas and oxygen gas may prevent the degradation of the characteristics of the TFT, more preferable, HCl+$CF_4$+$O_2$ dry etch gas may be used.

Figure 21:
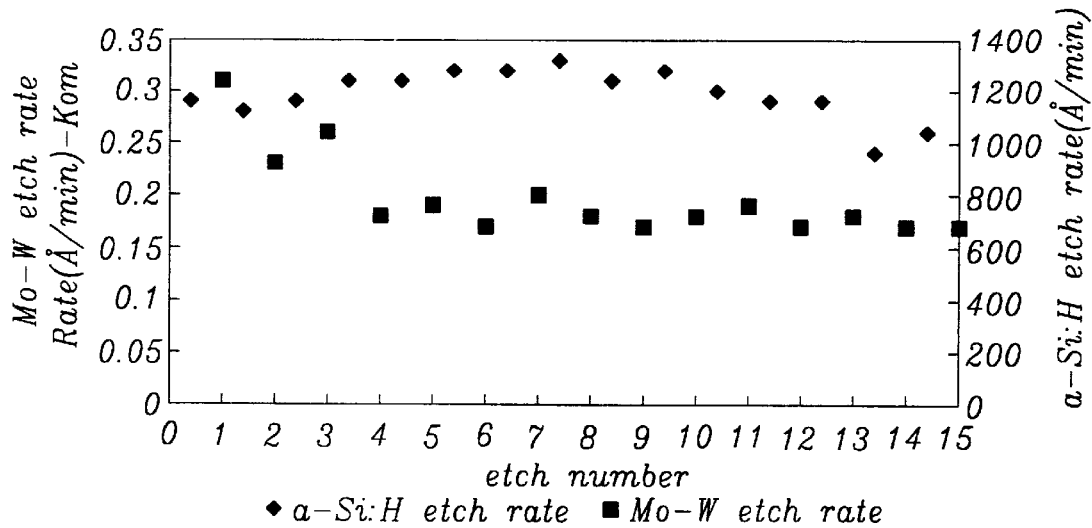
FIGS. 21 and 22 are graphs illustrating the etch rate of the MoW layer and the amorphous silicon layer when repeatedly etching the amorphous silicon layer for $HCL+CF_4$ dry etching gas system according to the first embodiment of the present invention.
Figure 22:
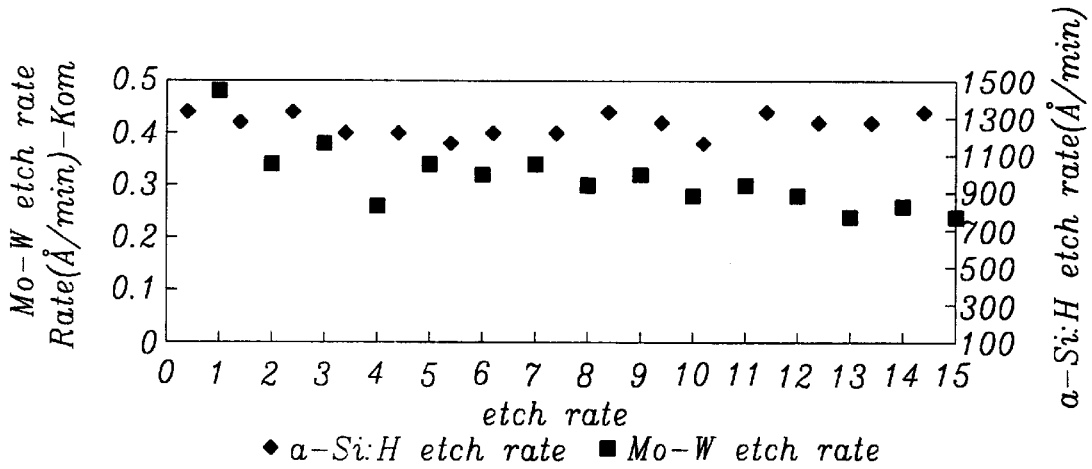

FIGS. 21 and 22 are graphs illustrating the etch rate of the MoW layer and the amorphous silicon layer when repeatedly etching the amorphous silicon layer for HCL+$CF_4$ dry etching gas system according to the first embodiment of the present invention. The result shown in FIG. 21 is measured at the higher pressure than FIG. 22.

The horizontal axis indicates repeat numbers (15 times) of dry etch process, the right side of the vertical axis indicates etch rate of amorphous silicon layer, and the left side of the vertical axis indicates the resistance according to etch rate of molybdenum-tungsten alloy layer.

As shown in FIGS. 21 and 22, the etch rate of the amorphous silicon layer decreases according to the increasing number, and it is recognized that the etch rate of the molybdenum-tungsten alloy layer decreases, based on the reduction of resistance. Lots of the polymer and the chemical components including molybdenum element are simultaneously formed when dry etching, but because they are not harmoniously exhausted, and are remained in etch chamber, the chemical components prevents the amorphous silicon layer to be etched. Furthermore, a conductive layer is formed due to re-deposition of a metallic etch residual. As shown in FIG. 22, if the pressure decreases, they are harmoniously exhausted, and the etch rate of the amorphous silicon layer is equal to or more 700 Å/min, and more improved than FIG. 21. However, the chemical components including molybdenum element are not removed effectively at low pressure, and the Ioff characteristic of the TFT from degrading is not improved. To improve this problem, oxygen is added at HCl+$CF_4$ dry etching system.

FIGS. 23 to 26 are graphs illustrating the etch rates of the MoW layer and the amorphous silicon layer for HCL+$CF_4$ dry etching gas system including oxygen according to the first embodiment of the present invention. HCL is 200 sccm, and $CF_4$ is 50 sccm in FIGS. 23 and 24. HCL is 200 sccm, and $CF_4$ is 200 sccm in FIGS. 25 and 26. The etch rates are measured in condition of 400 mTorr of pressure, 800 watts of power, 60 sec of time, and 20, 50 and 100 sccm of oxygen amounts in the range of 0 to 100 sccm.

Figures 23, 24:
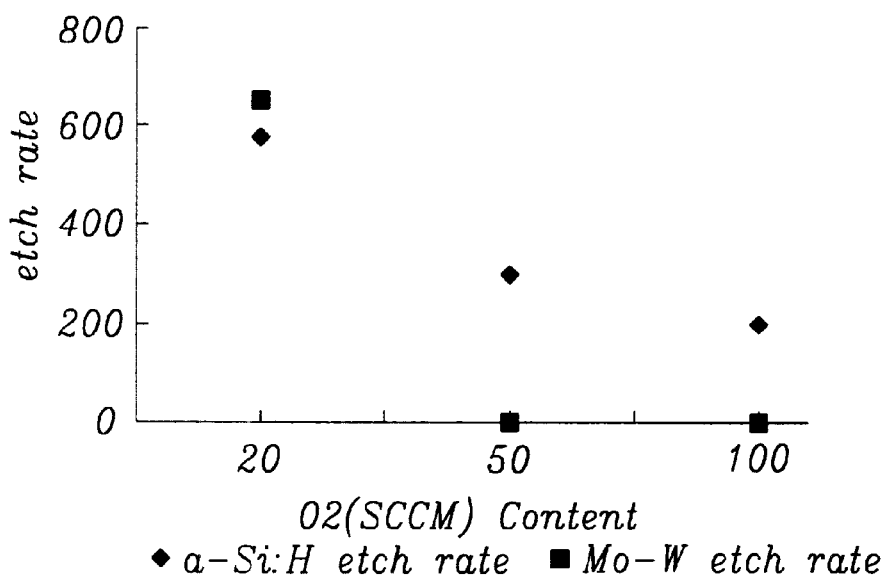
FIGS. 23 to 26 are graphs illustrating the etch rate of the MoW layer and the amorphous silicon layer for $HCL+CF_4$ dry etching gas system including oxygen according to the first embodiment of the present invention.
Figures 25, 26:
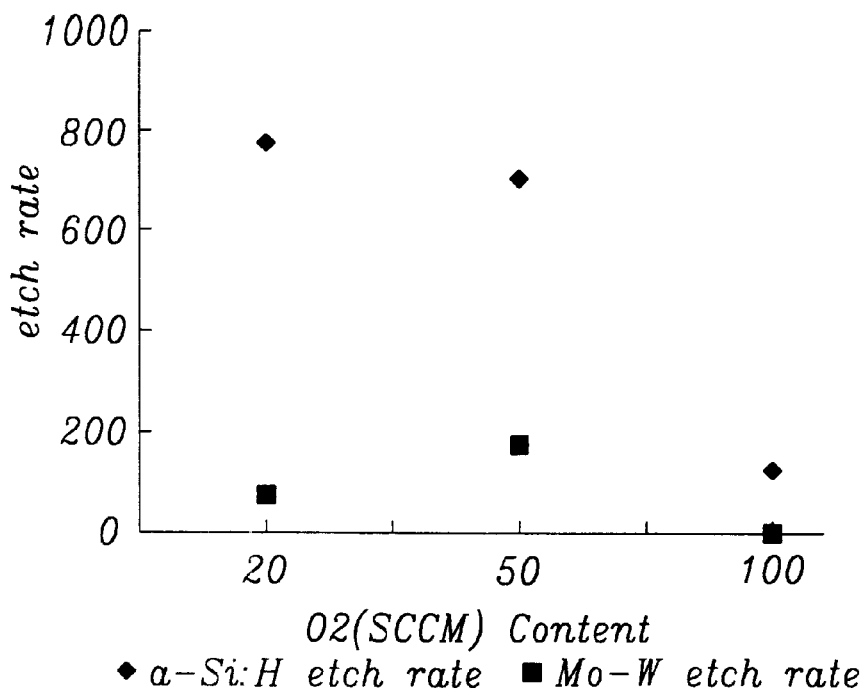

First, as shown in FIGS. 23 and 24, the etch rates are similarly 598 and 650 Å/min respectively in case of 200 sccm of oxygen amount. The differences of the etch rates of the amorphous silicon and the molybdenumtungsten alloy layer increase when oxygen amount increases 50 to 100 sccm, and the etch selectivity increases. Here, that the etch rates are negative means lots of the polymer to be formed. From this result, it is recognized that the etch selectivity of the amorphous silicon and the molybdenum-tungsten alloy layer is improved according to the increase of the amount of oxygen;

Second, as shown in FIGS. 25 and 26, it is also recognized that the etch selectivity of the amorphous silicon and the molybdenum-tungsten alloy layer is improved in case of 200 sccm of $CF_4$ to be increased. The etch rate of the molybdenum-tungsten alloy layer increases and decreases for the amount of oxygen to be increased, and it is recognized that lots of the polymer is formed in case of more than 100 sccm of the amount of oxygen.

As a result, if oxygen is added in the range of less than 100 sccm and the amount of $CF_4$ is controlled, the good etch selectivity may be achieved. It is preferable that the content of $O_2$ is equal to or less than 1/5 of the content of $CF_4$.

Figures 27, 28:
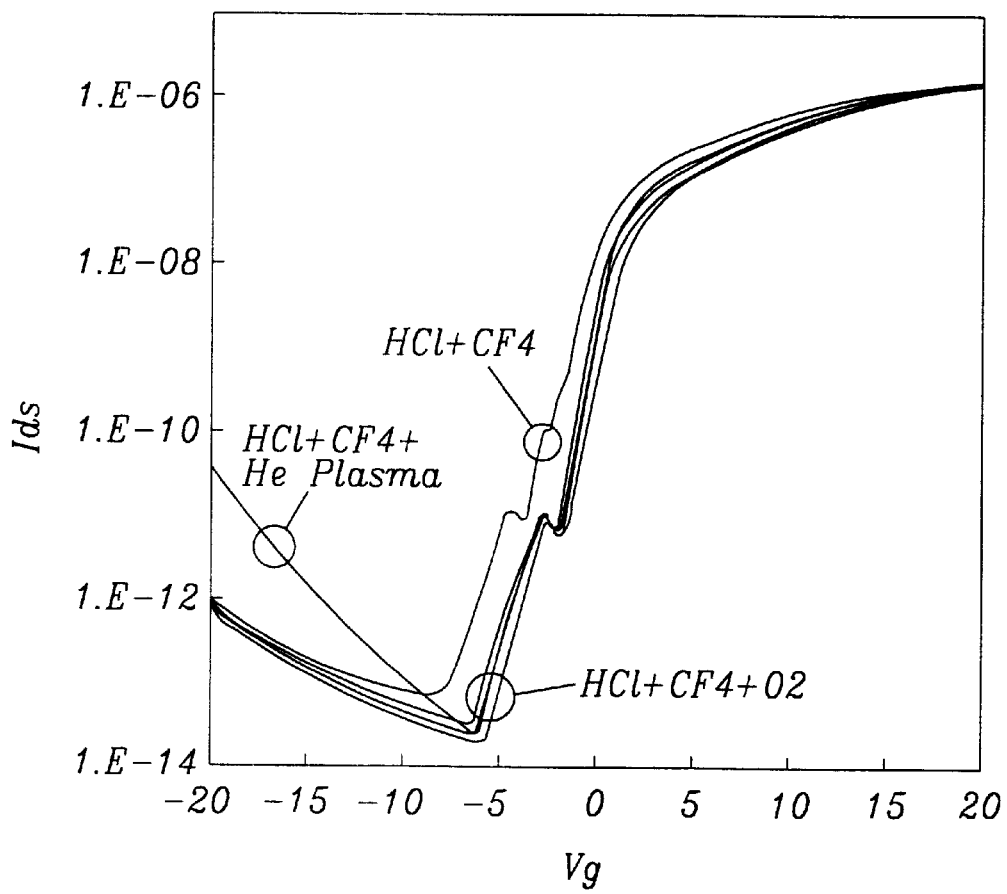
FIGS. 27 and 28 are graphs illustrating the characteristics of TFT for $HCL+CF_4+O_2$ dry etching gas system according to the first embodiment of the present invention.

FIGS. 27 and 28 are graphs illustrating the characteristics of TFT for HCL+$CF_4$+$O_2$ dry etching gas system according to the first embodiment of the present invention. The condition for dry etching was the pressure of 400 mTorr, the power of 800 W, HCl of 200 sccm, $CF_4$ of 200 sccm, $O_2$ of less than 100 sccm and the time of 80 sec.

As shown in FIGS. 27 and 28, the characteristic of Ioff is bad without applying the $H_2$ plasma treatment and adding the oxygen, but the characteristics of Ioff is very good, and threshold voltage is highest when adding the oxygen.

Figure 29:
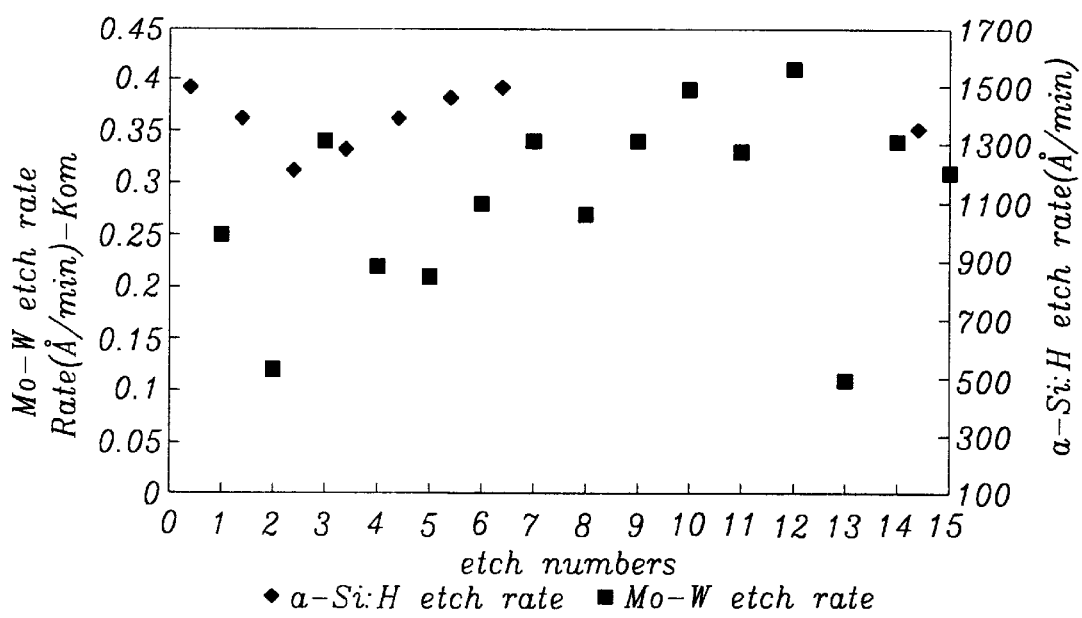
FIGS. 29 is a graph illustrating the etch rate of the MoW layer and the amorphous silicon layer for $HCL+CF_4+O_2$ dry etching gas system according to the first embodiment of the present invention.

FIGS. 29 is a graph illustrating the etch rate of the MoW layer and the amorphous silicon layer for HCL+$CF_4$+$O_2$ dry etching gas system when repeatedly etching process according to the first embodiment of the present invention.

The horizontal axis indicates repeat numbers (15 times) of dry etch process, the right side of the vertical axis indicates etch rate of amorphous silicon layer, and the left side of the vertical axis indicates the resistance according to etch rate of molybdenum-tungsten alloy layer.

As shown in FIG. 29, the etch rates of the amorphous silicon layer and the molybdenum-tungsten alloy layer is different every time for HCL+$CF_4$+$O_2$ dry etching gas system. This result is very different from FIGS. 21 and 22.

From the above-described results, if the HCl+$CF_4$+$O_2$ dry etching gas system is used to etch the doped amorphous silicon layer, the characteristics of TFT may be improved with one etch process without the plasma treatment as additional process. Furthermore, through the times of the etch process increase, the decrease of the etch rates for the amorphous silicon layer and the molybdenum-tungsten alloy layer may be prevented.

Figure 8A:
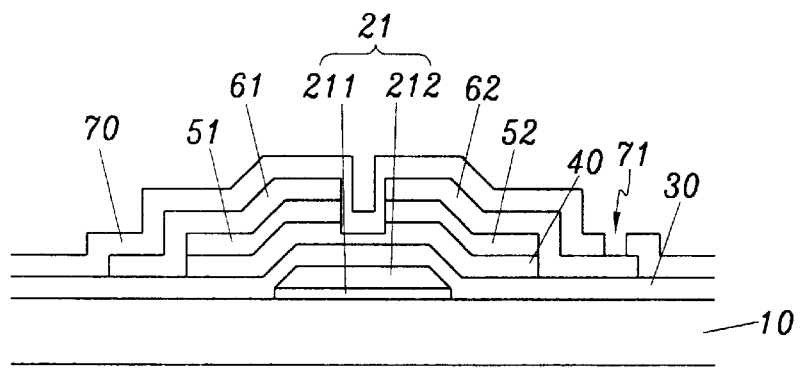
Figure 8B:
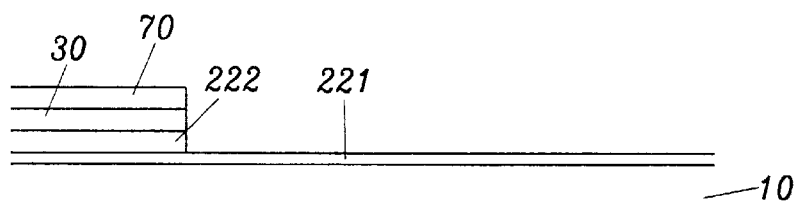
Figure 8C:
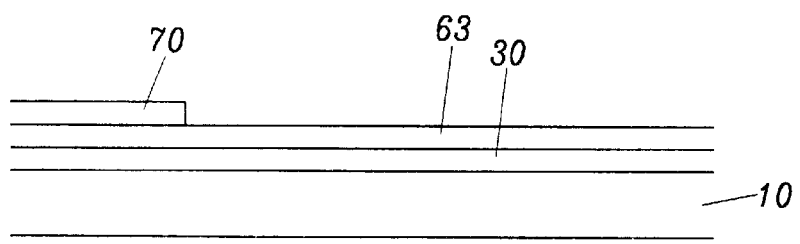

Next, as shown in FIGS. 8A–8C, a passivation layer 70 is deposited and photo etched with the gate insulating layer 30 using a fourth mask to form a contact hole 71 exposing the drain electrode 62, and the gate pad 22 and the data pad 63 are also exposed. The upper layer 222 of the gate pad 22 made of aluminum-neodymium alloy is removed to expose the lower layer 221 made of chromium because the aluminum alloy is not good for pad.

Finally, as shown in FIGS. 2–4, an ITO layer is deposited and dry etched using a fifth mask to form a pixel electrode 80 connected to the drain electrode 62 through the contact hole 71. An ITO electrode 81 for gate pad and an ITO electrode 82 for data pad which are connected to the gate pad 22 and the data pad 63 respectively are also formed.

If the molybdenum alloy is used for the upper layer of the gate pad 22, the upper layer needs not to be removed.

In the second embodiment of the present invention, the doped amorphous silicon layer may be etched using the photoresist pattern as an etch mask, the photoresist pattern is stripped and the in-situ He plasma treatment is performed.

Figure 30:
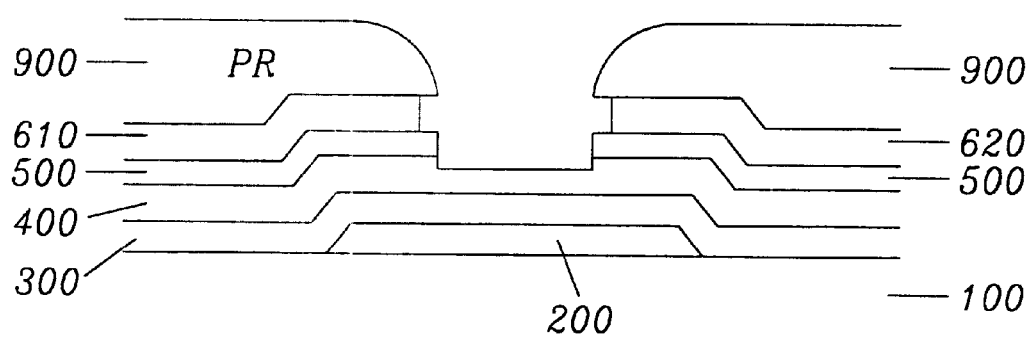
FIG. 30 shows a cross-sectional view of a TFT substrate illustrating a manufacturing method according to the second embodiment of the present invention.

FIG. 30 shows a cross-sectional view of a TFT substrate illustrating the manufacturing method according to the second embodiment of the present invention.

As shown in FIG. 30, a molybdenum alloy layer is etched using a photoresist pattern 900 as a mask to form a source and a drain electrodes 610, 620. Without stripping the photoresist pattern 900, a doped amorphous silicon layer 500 is dry etched using the photoresist pattern as a mask to prevent the source and the drain electrodes 610, 620 from being consumed during the etching process. The $HCl+SF_6$ gas system is used as the dry etching gas.

Because the photoresist pattern 900 is not removed, the source/drain electrodes are not etched away under the photoresist pattern 900. However, the side wall of the source and the drain electrodes 610, 620 is partially etched to form a step-like pattern between the source/drain electrodes and the doped amorphous silicon layer 500.

According to the second embodiment of the present invention, an washing process using $O_2$ gas is added to remove the hardened photoresist 900, and in-situ He plasma treatment is performed after the ashing process.

FIG. 31 is a table showing the manufacturing methods according to the second embodiment and the etch rates of the doped amorphous silicon layer. FIG. 32 is a table showing the results of the EDS (electric data system) test of the TFT formed according to the condition shown in FIG. 31. EDS test is evaluating the characteristics and performance of the panel by measuring the electrical characteristics, i.e., Ioff, Ion, Vth, gradient, resistance, capacitance after the manufacturing the panel at the TEG (test element group) region. Ioff is the current passing through the drain electrode when the gate voltage is −5V and the source/drain voltage is 10V, it is the better as the smaller. Ion is the current passing through the drain electrode when the gate voltage is 20V and the source/drain voltage is 10V, it is the better as the larger. Vth is the threshold voltage and gradient is the slope of the line to calculate the threshold voltage. Using the values described above, the mobility can be calculated, and FIG. 21 is a table showing the mobility calculated using the EDS data according to the second embodiment.

As shown in FIG. 31, Condition 1 is the case that the photoresist pattern on the data pattern is stripped before the etching the doped amorphous silicon layer and He plasma treatment is performed after etching the doped amorphous silicon layer. In this case, the etched thickness of the doped amorphous silicon layer was about 1,283 Å. In Conditions 2 and 3, photoresist pattern on the data pattern is stripped first and the doped amorphous silicon layer is etched using $CF_4+HCl$. To investigate the change of the characteristics of the TFT, ashing is performed (Condition 2) or ashing and in-situ He plasma treatment are performed (Condition 3).etched thickness of doped amorphous silicon layer was about 1,289 Å.

In Conditions 4–6, the doped amorphous silicon layer is etched using the photoresist pattern formed to make the source/drain electrodes as a mask. In Condition 4, after etching the doped amorphous silicon layer, the $O_2$ ashing is performed, and the He plasma treatment is skipped. In that case, the etched thickness of the doped amorphous silicon layer was about 1,154–1,167 Å. In Condition 5, the doped amorphous silicon layer is etched using $CF_4+HCl$ gas, ashing is performed and $H_2$ plasma treated, and the doped amorphous silicon layer was etched about 1,166 Å. Finally, in Condition 6, the doped amorphous silicon layer is etched using $CF_4+HCl$ gas, ashing and in-situ He plasma treatment are performed, and the doped amorphous silicon layer was etched about 1,114–1,211 Å.

As shown in FIG. 32, off state currents are equal to or less than 1 pA except Condition 4. Condition 6 where in-situ He plasma treatment is performed has the best on state current characteristic, while Ion is 4 $\mu$A. Threshold voltages Vth are relatively low in Conditions 3 and 6 where He plasma treatment is performed. The gradient increases from Condition 1 to Condition 6. The contact resistances are lower in Conditions 1–3 where the photoresist pattern is removed first compared with in Conditions 4–6 where the doped amorphous silicon layer is etched using the photoresist pattern as a mask. On the contrary, source/drain resistances are lower in Conditions 4–6 where the doped amorphous silicon layer is etched using the photoresist pattern as a mask compared with in Conditions 1–3 that the photoresist pattern is removed first.

The mobility can be calculated by the equation described below:

$$\text{Mobility}=(2*(\text{grad})^2*L)/(W*Cj).$$

Here, L and W is the length and the width of the channel of the TFT respectively. As shown in FIG. 33, the critical dimension of the gat in the ACI (after cleaning inspection) is 9.231 $\mu$m in Conditions 1–3, and 9.095 $\mu$m in Conditions 4–6. The width of the source/drain electrode is 8.847 $\mu$m. Cj is the capacitance per unit area. The designed width and the length of the channel of the TFT is 14 $\mu$m and 3.5 $\mu$m respectively. The actual width and the length of the channel is 12.847 $\mu$m and 4.653 $\mu$m respectively in Conditions 1–3, 12.870 $\mu$m and 4.630 $\mu$m respectively in Conditions 4–6.

The calculated mobility has, as shown in FIG. 21, a maximum value in Condition 6. The mobility is 0.937–0.961. This result is very similar to the result in the EDS test shown in FIG. 20.

According to the embodiments of the present invention, the doped amorphous silicon layer is etched using the data pattern or the photoresist pattern formed to make a data pattern and in-situ He plasma treatment is performed to decrease the Ioff current while keeping the Ion characteristics. Furthermore, if $HCl+CF_4+O_2$ dry etching gas is used to etch the doped amorphous silicon layer, the characteristics of TFT may be improved with one etch process without the additional plasma treatment, and through the times of the etch process increase, the decrease of the etch rates for the amorphous silicon layer and the molybdenum-tungsten alloy layer may be prevented. The corrosion of wire made of aluminum or aluminum alloy may be prevented for using oxygen plasma treatment.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A manufacturing method of a thin film transistor comprising the steps of:

forming a gate electrode on a substrate;

forming a gate insulating layer on the gate electrode;

forming an intrinsic amorphous silicon layer that extends on the gate insulating layer and opposite the gate electrode;

forming a doped amorphous silicon layer on the intrinsic amorphous silicon layer;

forming source and drain electrodes separated from each other on the doped amorphous silicon layer;

dry etching the doped amorphous silicon layer using chloride gas; and performing an axygen plasma treatment wherein the step of performing oxygen plasma treatment comprises the step of performing oxygen plasma treatment using one of $CF_4$, $SF_6$, $C_2F_6$, $CHF_3$ and $C_2F_8$ gas.

2. The method of claim 1, wherein the oxygen plasma treatment is insitu after the dry etching.

3. The method of claim 2, wherein the source and the drain electrodes comprise one of a single-layered structure including aluminum and a double-layered structure including the single-layered structure.

4. The method of claim 3, wherein the pressure in the oxygen plasma treatment is equal to or less than 1,000 mTorr.

5. The method of claim 4, wherein the power in the oxygen plasma treatment is equal to or less than 1,000 watts.

6. A manufacturing method of a thin film transistor comprising the steps of:

forming a gate electrode on a substrate;

forming a gate insulating layer over the gate electrode;

forming an intrinsic amorphous layer on the gate insulating layer over the gate electrode;

forming a doped amorphous silicon layer on the intrinsic amorphous silicon layer;

depositing a metal layer on the doped amorphous silicon layer;

forming a photoresist pattern on the metal layer;

forming source and drain electrodes by etching the metal layer using the photoresist pattern as a mask; and dry etching the doped amorphous silicon layer using a mask and a $HCl+CF_4+O_2$ dry etching gas.

7. The method of claim 6, wherein the source and drain electrodes comprise one of a single layer that includes molybdenum and a double layer including the single layer.

8. The method of claim 7, wherein the content of $O_2$ is equal to or less than 1/5 of the content of $CF_4$.

9. The method of claim 8, wherein the content of $O_2$ is equal to or less than 100 sccm.

10. The method of claim 6, wherein the mask comprises the source and the drain electrodes.

11. The method of claim 6, wherein the mask comprises the photoresist pattern.

* * * * *

UNITED STATES PATENT AND TRADEMARK OFFICE
CERTIFICATE OF CORRECTION

PATENT NO.    : 6,372,535 B1                                              Page 1 of 1
DATED         : April 16, 2002
INVENTOR(S)   : Lyu It is certified that error appears in the above-identified patent and that said Letters Patent is hereby corrected as shown below:

Column 11,
Line 16, please change "axygen" to -- oxygen --.

Column 12,
Line 5, please add -- silicon -- following "amorphous".

Signed and Sealed this

Second Day of July, 2002

Attest:

Attesting Officer

JAMES E. ROGAN
Director of the United States Patent and Trademark Office